United States Patent [19]

Martin et al.

[11] Patent Number: 5,180,994
[45] Date of Patent: Jan. 19, 1993

[54] DIFFERENTIAL-LOGIC RING OSCILLATOR WITH QUADRATURE OUTPUTS

[75] Inventors: Kenneth W. Martin, Los Angeles; Aaron W. Buchwald, Marina del Rey, both of Calif.

[73] Assignee: The Regents of the University of California, Oakland, Calif.

[21] Appl. No.: 656,352

[22] Filed: Feb. 14, 1991

[51] Int. Cl.$^5$ .................... H03B 5/02; H03B 27/00
[52] U.S. Cl. ......................... 331/38; 331/45; 331/57; 331/60; 331/DIG. 3
[58] Field of Search ........... 331/57, 135, 136, DIG. 3, 331/60, 45, 38

[56] References Cited

U.S. PATENT DOCUMENTS

| | | | |
|---|---|---|---|
| 3,235,796 | 2/1966 | Tarczy-Hornoch | 331/57 X |
| 4,833,695 | 5/1989 | Greub | 331/57 X |
| 4,884,041 | 11/1989 | Walker | 331/57 |

FOREIGN PATENT DOCUMENTS 60-169215 9/1985 Japan ..................... 331/57

Primary Examiner—Siegfried H. Grimm
Attorney, Agent, or Firm—Daniel L. Dawes

[57] ABSTRACT

A topology for a high speed voltage controlled oscillator (VCO) with quadrature outputs is produced utilizing four inverting differential circuits. The fully differential four stage ring oscillator has outputs from alternate delay circuits combined in balanced exclusive OR gate frequency doublers to provide both in-phase and quadrature output signals at twice the ring oscillator frequency. The period of the quadrature delay signals is four gate delays and is easily realized in the Ghz frequency ranges. The in-phase and quadrature output signals are again combined in a balanced exclusive OR gate frequency doubler to obtain a final output frequency quadruple the ring oscillator frequency.

8 Claims, 4 Drawing Sheets

DIFFERENTIAL-LOGIC RING OSCILLATOR WITH QUADRATURE OUTPUTS

BACKGROUND OF THE INVENTION

1. Field of the Invention

The invention relates to the field of high-speed differential-logic circuits and in particular to a differential-logic, ring oscillator having a plurality of quadrature outputs.

2. Description of the Prior Art

Ring oscillators are well known and are comprised of a plurality of inverters coupled in a cascaded series with the output of the cascade fed back to the input for the first inverter stage in the cascade. Given enough inverter stages, typically five or more, the ring oscillator will oscillate at a natural or characteristic frequency largely defined by the switching delays of each of the inverter stages.

The use of differential circuitry is also known in logic circuits. In differential-logic circuits, instead of driving the logic lines to a logical high or low voltage state, a pair of logic lines is provided for each bit. Logic voltage levels on the two lines are inverted or logically complementary. When the bit represented by the pair lines is to change state, the voltage polarity of the pair of lines switches. The transition between the pair of lines is detected to signify the change in the logic level.

Voltage controlled oscillators (VCO'S) are also well known and used in communication circuits as well as a large variety of other applications. VCO's with quadrature outputs are particularly important in communication circuits, such as a binary phase shift keyed (BPSK) demodulator, quadricorrelator frequency discriminator, and high-speed clock recovery circuits.

Extremely high speeds are very important in a fully integrated, fiber optic receiver where the data rates typically are set at 500 megabits/s. Typically, in prior art circuits, the maximum VCO oscillating frequency of the clock recovery circuit will often limit the maximum available data rate in a fiber optic receiver. Some problems with the limited VCO speeds have been circumvented for data rates above 2.5 Gbits/s by the use of surface acoustic wave (SAW) filters. The surface acoustic wave filter extracts the clock signal after a nonlinear operation has been performed on the data. However, such SAW filters are typically bulky hybrid receivers having numerous difficulties relating to interconnections and temperature stability.

For a fully integrated high-speed receiver, the prior art has devised high-speed VCO'S for the clock recovery phase-locked loop as distributed or lumped resonant type oscillators with a frequency maximum that can approach the theoretical maximum frequency of the devise. However, these types of oscillators require precision inductors and transmission lines to be fabricated on chip. Furthermore, the tuning range of such VCO'S is usually small.

In contrast, conventional digital output oscillators, such as ring oscillators or a multivibrators, are very simple to design and are characterized by a large tuning range. However, these conventional ring oscillators and multivibrators are typically limited to a maximum frequency of approximately 1/10 the maximum switching frequency of the devices of which they are built.

What is needed then is a topology for high-speed digital output VCO with both in-phase and quadrature outputs which would have a frequency of utility for clock recovery in multi Gbit/s fiber optic data links. Although the illustrated embodiment is described with this specific application in mind, it is expressly contemplated that any application where quadrature signals are needed or can be advantageously employed is also included within the scope of the invention.

BRIEF SUMMARY OF THE INVENTION

The invention is an improvement in a ring oscillator comprising a plurality of inverting delay circuits. Each one of the plurality of inverting delay circuits has an input and output line. The output is inverted relative to the input. The plurality of delay circuits are cascaded together in series. The output of one of the delay circuits is coupled to the input of a sequential other one of the delay circuits in the series. The plurality of cascaded delay circuits therefore have a first delay circuit and a last delay circuit. The delay circuits are characterized by being differential delay elements. The input of each delay circuit is a differential pair of lines and the output of each the delay circuit is a differential pair of lines. A first state of voltage levels on the differential pair of lines comprising the outputs and inputs is characterized as a 0 state and reversal of the voltage levels between the differential pair of lines is characterized as a 1 state. The last delay circuit has its output coupled to the input of the first delay circuit and is logically reversed before being coupled to the input of the first delay circuit. As a result, a high speed ring oscillator adaptable for differential logic is provided.

The number of the delay circuits comprising the plurality of inverting delay circuits is an even number, or in the illustrated embodiment are four in number.

The improvement further comprises a circuit element for controlling the delay generated by each of the delay circuits and hence oscillation of the ring oscillator.

The differential pair of lines comprising the input and output lines of each of the delay circuits is characterized as an identifiable signal and its logical complement on the lines respectively. The signal and its logical complement output from each delay circuit is coupled to the input of the next sequential delay circuit as the input signal and its complement of the next sequential delay circuit. Except the last delay circuit has its output signal and its logical complement inverted by reversing line connections when feeding back the output signal of the last delay circuit to the input of the first delay circuit.

The invention is also characterized as a high frequency ring oscillator having an output frequency comprising an even number of differential amplifiers coupled together in a series. Each differential amplifier has a differential input and a differential output. The differential output of one amplifier is coupled to the differential input of a next one of the amplifiers in the series. The series of amplifiers has a first amplifier and a last amplifier. The differential output of the last amplifier is transposed and coupled to the differential input of the first amplifier. Each of the differential amplifiers has a substantially equal delay and inverts the differential input to generate an inverted differential output.

The series of amplifiers can still further be characterized as comprising an even subseries of differential amplifiers and an odd subseries of differential amplifiers alternately coupled with each other in the series. A plurality of mixers are provided. Each mixer has a pair of differential input lines and generates a differential output on a corresponding pair of differential output lines. The differential outputs from consecutive ones of the differential amplifiers of the odd subseries are coupled to one of the plurality of mixers. The differential outputs from consecutive ones of the differential amplifiers of the even subseries are coupled to inputs of other ones of the mixers. The differential outputs of the mixers, which are coupled to the even and odd consecutive differential amplifiers, produce differential output signals at twice the frequency of the ring oscillator and are in quadrature with each other.

The ring oscillator further comprises an additional mixer. The outputs of the mixers, which are in quadrature, are coupled as inputs to the additional mixer. The output of the additional mixer is a differential signal with a frequency four times the frequency of the ring oscillator.

The invention can be better visualized by now turning to the following drawings wherein like elements are referenced by like numerals.

BRIEF DESCRIPTION OF THE DRAWINGS

FIG. 5 is a wave diagram showing the relationship between the two quadrature outputs at 2 $F_{osc}$ generated by the first level of mixers shown in FIG. 2a.

The invention and its various embodiments may now be better understood by turning to the following detailed description.

DETAILED DESCRIPTION OF THE PREFERRED EMBODIMENTS

A topology for a high speed voltage controlled oscillator (VCO) with quadrature outputs is produced utilizing four inverting differential circuits. The fully differential four stage ring oscillator has outputs from alternate delay circuits combined in balanced exclusive or gate frequency doublers to provide both inphase and quadrature output signals at twice the ring oscillator frequency. The period of the quadrature delay signals is four gate delays and is easily realized in the GHz frequency ranges. The in-phase and quadrature output signals are again combined in a balanced, exclusive or gate, frequency doubler to obtain a final output frequency quadruple the ring oscillator frequency.

Figure 1:
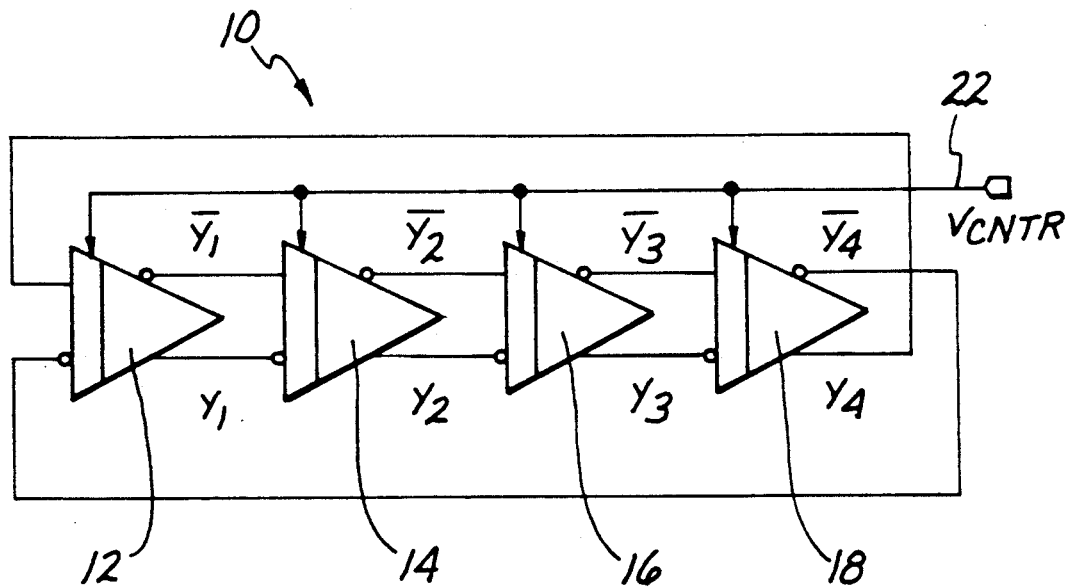
FIG. 1 is a schematic diagram of a differential-logic ring oscillator incorporating the invention.
Figure 2A:
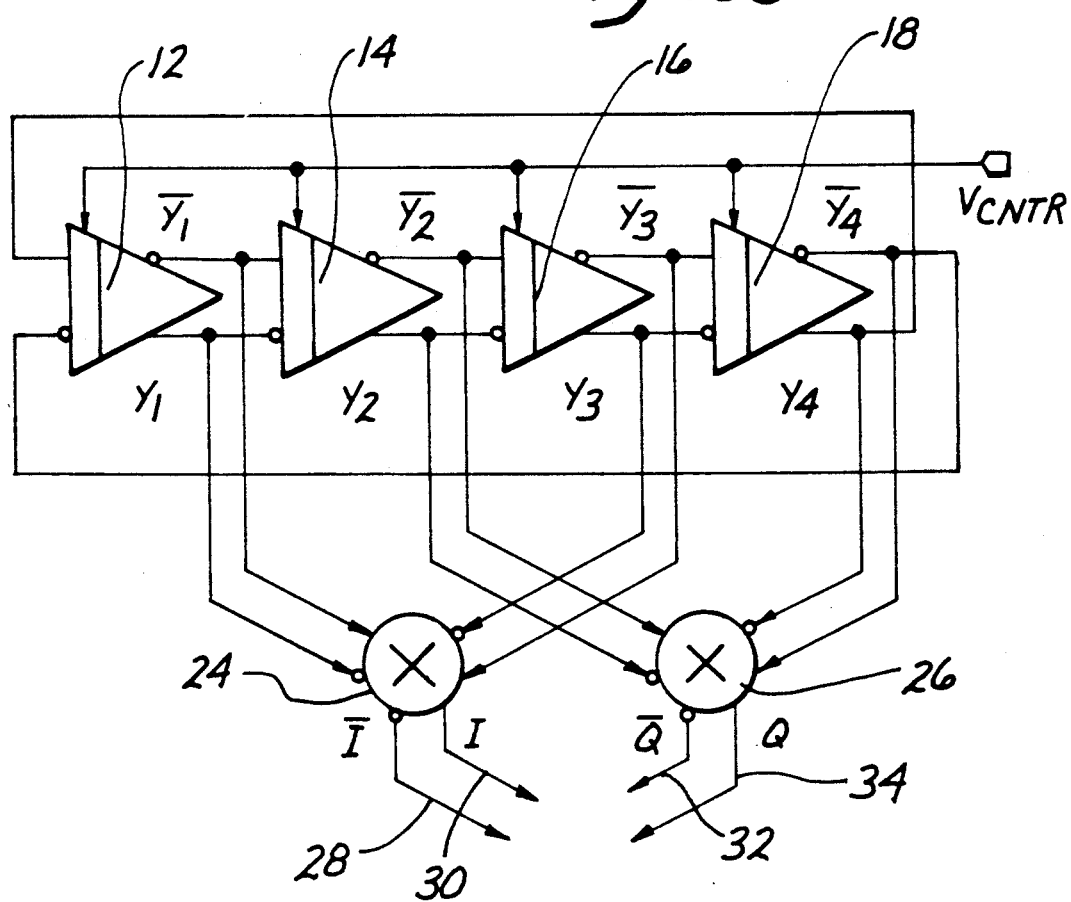
FIG. 2a is a block diagram of a VCO incorporating the ring oscillator of FIG. 1 in combination with mixers for generating multiple quadrature outputs with a frequency of 2 $F_{osc}$, where $F_{osc}$ is the frequency of the ring oscillator.
Figure 3:
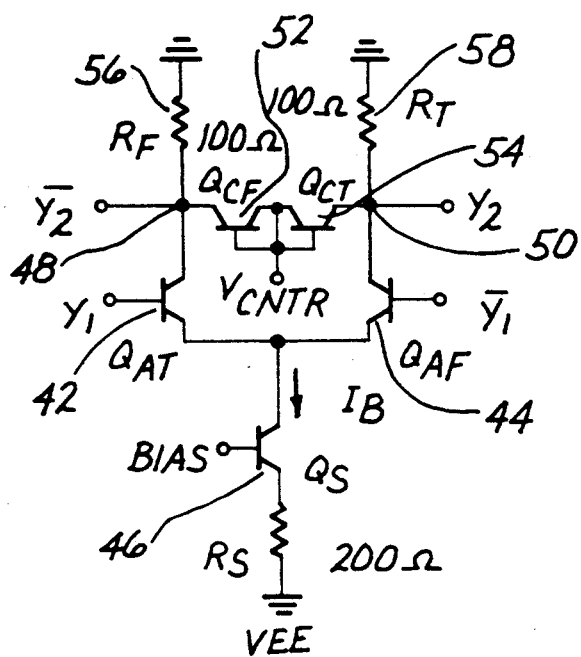
FIG. 3 is a schematic diagram of one example of a delay element used for a differential pair of lines in the ring oscillator of FIGS. 1 and 2a or 2b.

The VCO of the invention is based on a four stage ring oscillator as shown in the block diagram of FIG. 1. In order to establish oscillation an odd number of inversions is required. Therefore, the differential input to one of the delay cells is reversed. In the case shown in FIG. 1 the output of the last delay cell is reversed and fed back to the input of the first delay cell. The delay elements of FIG. 1, each of which are schematically shown and described below in connection with FIG. 3, are matched. When an even number of such matched delay elements are used, then each pair of taps separated by n/2 stages, where n equals the number of delay units, will be exactly 90 degrees out of phase. Any phase shift caused by loading can be cancelled by equally loading each of the outputs, such as by having matched mixers as shown in FIGS. 2a and b. When the quadrature pairs are mixed, the resulting mixed signal is at twice the input frequency. In the case of a four stage ring oscillator, the first level of mixers will produce two signals at twice the frequency of the ring oscillator, which signals are each 90 degrees out of phase. These two quadrature signals can then be again combined in another mixer to produce a signal which is four times the frequency of the ring oscillator.

Turn now and consider in detail the ring oscillator of FIG. 1. The ring oscillator, generally denoted by reference number 10, is comprised of the four cascaded delay elements 12–18. The number of elements could be increase to any even number, if desired. The use of less than four elements may jeopardize the ability of the ring oscillator to oscillate in a stable manner. It has been determined according to the invention, that four delay elements is the practically optimal minimum.

The output of the first delay element 12 is the signals $y_1$ and $y_1^*$. In the following the superscripted symbol * denotes the logical complement of the signal. In FIG. 1 one input and one output of each delay element shows a bubble inverter. This symbolizes that the lines are logically complementary. The delay circuit, such a shown in FIG. 3, inverts both input lines. Thus, $y_1$ and $y_1^*$ are logically complementary. The output $y_1$ is coupled to the lower input of the next delay element 14 as depicted in FIG. 1, while $y_1^*$ is coupled to the upper input of delay element 14 as depicted in FIG. 1. Hereinafter, the differential pair of lines will simply be termed upper and lower lines without reference to their logical value and without repeated reference to the Figures.

Similarly, the output of delay element 14, $y_2^*$, is coupled to the upper input of the next delay element 16 and output $y_2$ of delay element 14 is coupled to the lower input of delay element 16. The outputs of delay element 16, $y_3$ and $y_3^*$ are similarly coupled to the inputs of delay element 18. The $y_4^*$ output of delay element 18 is switched or fed back to the lower input of first delay element 12. Similarly the $y_4$ output of delay element 18 is switched or fed back to the upper input of delay element 12.

A simple example will illustrate the operation of ring oscillator 10 of FIG. 1. Assume that the output $y_1$ of delay element 12 corresponds to a logical 1 and $y_1^*$ to logical 0. $Y_1$ is input to delay element 14, delayed by the switching speed of the circuit and output as $y_2^*$ which is 1. $Y_1^*$ is input, delayed and output as a signal $y_2=0$. The signal has now been inverted. $Y_2$ and $y_2^*$ are input to delay element 16, delayed and output as $y_3^*=0$ and $y_3=1$ respectively. $Y_3$ and $y_3^*$ are input, to delay element 18 and output as $y_4^*=1$ and $y_4=0$ respectively. $Y_4$ is fed back to the upper input of amplifier 12 which then outputs it as $y_1^*=1$. Thus $y_1^*$ has now changed state or oscillated ½ cycle. Similarly, $y_4^*$ is fed back to the lower input of delay element 12, and output as a new value for $y_1 = 0$. The value for $y_1$ and $y_1^*$ have now been once inverted. This completes one half cycle.

It should be noted that it is not necessary that the delay elements be inverters. It is only necessary that the polarity of the differential pair of lines be inverted an odd number of times in one pass through the circuit. In the example, each of the four delay element inverts the signal and then the output lines of the final delay element 18 are switched or reversed when fed back to the first delay element 12 for a total of five inversions. The same result could be obtained if none of the delay elements inverted the signal, and the only inversion occurred with the reversed feedback.

If the delay through each delay element 12-18 is t, one half of a period, T/2, will equal nt, where n is the number of inverters or delay elements. The frequency of ring oscillator 12 will thus be $1/(2\ nt)$.

If, as in the present case, each of the delay times of the delay elements 12-18 are matched, the signal at $y_3$ is always equal to the signal at $Y_1$, but is shifted by 90 degrees. Similarly, signal $y_2$ is always equal to the signal of $y_4$, but again shifted in phase by 90 degrees. Therefore, one quadrature pair is formed by $y_1$ and $y_3$, and a second quadrature pair by $y_2$ and $y_4$.

As shown in FIG. 2a, these quadrature pairs are coupled to mixers 24 and 26. It is a well known result that when quadrature signals or signals out of phase by 90 degrees at the same frequency are provided to the input of an analog mixer, the output signal will be double the frequency of the two input signals. Thus mixer 24 produces a differential output signal on lines 28 and 30 which is at a frequency twice the ring oscillator frequency. Similarly, the output of mixer 26, which receives the quadrature pair, $y_2$ and $y_4$, produces a differential pair of signals on lines 32 and 34 which is at twice the ring oscillator frequency.

Now it further turns out that the phase of the frequency on differential pair of lines 28 and 30 is 90 degrees out of phase from the signal provided on differential pair of lines 32 and 34. Therefore, as depicted in FIG. 2b these differential signals can similarly be input into an analog mixer 36 whose output 38 and 40 is a differential pair of signals whose differential is at four times the ring oscillator frequency or $2/nt$.

As previously stated, additional delay elements could be used to produce multiple combinations of quadrature signals if needed. For example, if four delay elements configured exactly as described in connection with FIG. 3 were cascaded in series to the output of the last delay element 18 and then fed back as taught, the same frequency would be obtained at the output of the highest level of mixers in addition to which the number of mixers would have to be increased. The frequency of a eight element ring oscillator would be 1/16t. Four pairs of quadrature signals could be combined in four mixers, the output of these combined in two mixers, and then finally these last two combined in a final mixer, which would multiply the frequency by a factor of eight. The frequency provided at the output of the last mixer would then be 1/2t, the same frequency as generated by the circuit shown in FIG. 2b.

Six delay elements could be combined to produce three quadrature signals as opposed to the two shown in FIG. 2a. Similarly, ten delay elements combined according to the teaching of the invention to produce five quadrature signals, which in turn can be combined with each in any fashion desired to build up phased signals at different multiples of the ring oscillator frequency.

Figure 2B:
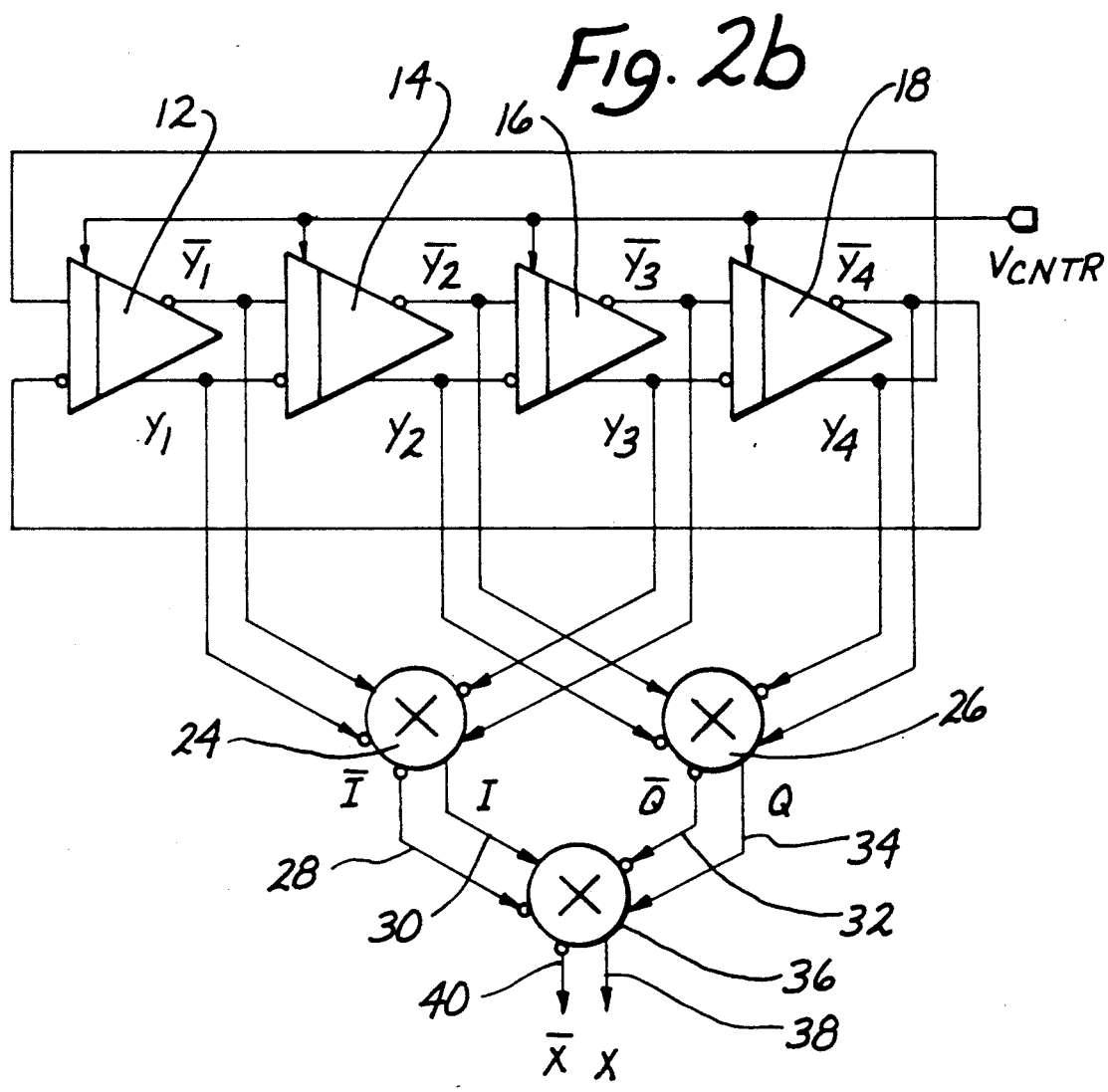
FIG. 2b is a block diagram of a VCO incorporating the ring oscillator of FIG. 1 in combination with mixers for generating quadrature outputs with a frequency of 4 $F_{osc}$.

Therefore, although the invention has been shown as having four delay elements producing two quadrature signals at $2 F_{osc}$ in FIG. 2a and one quadrature signal at 4 Fosc in FIG. 2b, any even number of delay elements could be combined to produce a corresponding quadrature signal at every other delay element, which in turn can then be combined in mixers to produce higher order quadrature signals of arbitrary combination.

Turn now to FIG. 3 wherein one example is shown for delay elements 12-18 in FIGS. 1, 2a and 2b. It is expressly to be understood that many other types of circuits could be used for delay elements other than that depicted in FIG. 3, which is provided only by way of example. The delay element 14 is shown in the specific schematics. Inputs $y_1$ and $y_1^*$ are provided to transistors 42 and 44. The collectors of transistors 42 and 44 are coupled to nodes 48 and 50 respectively where the outputs $y_2^*$ and $y_2$ respectively are generated. A control voltage, VCNTR, is provided to the bases of transistors 52 and 54. The control voltage, VCNTR, changes the oscillating frequency by varying the load capacitance of reversed biased base-to-emitter junctions. Nodes 48 and 50 are coupled to ground through load resistors 56 and 58 respectively. Thus, what is provided is a differential current-mode-logic circuit with a voltage controlled frequency.

Figure 4:
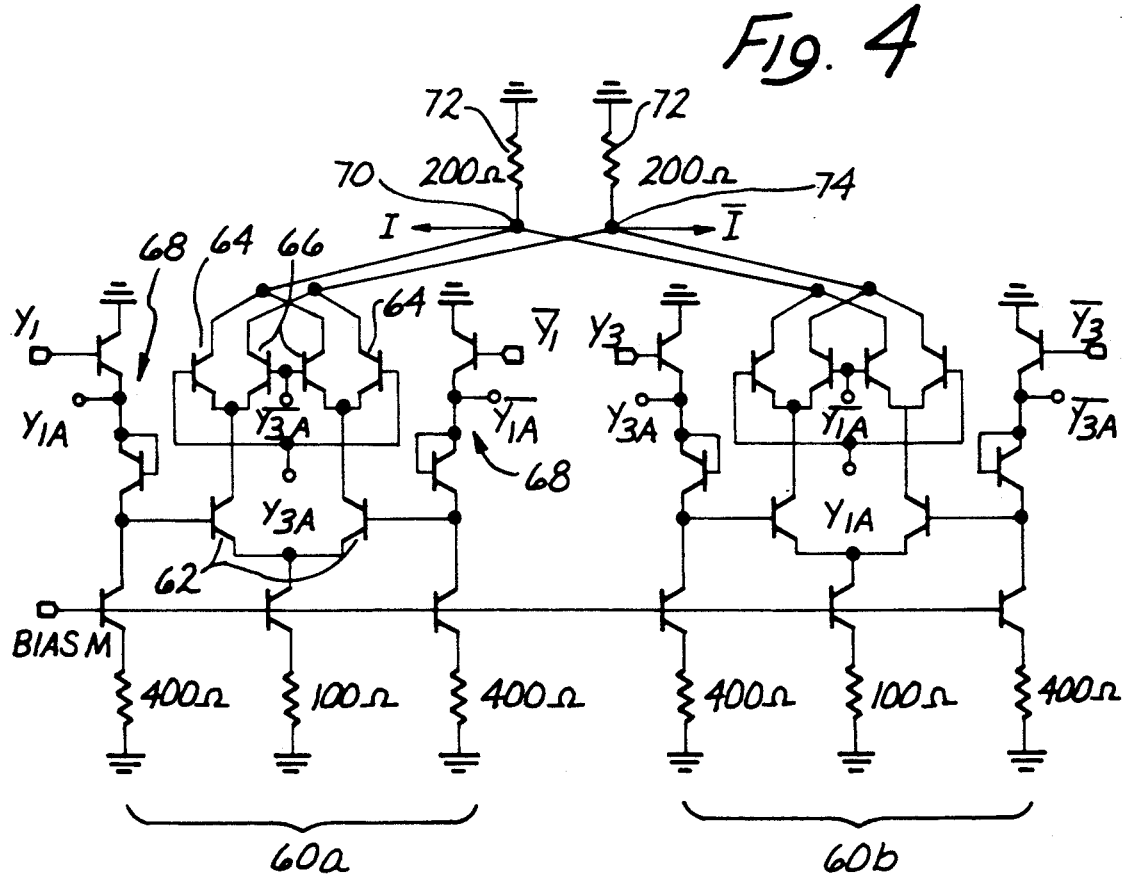
FIG. 4 is a schematic diagram of a fully balanced XOR gate mixer circuit which may be used in the block diagram of FIG. 2a or 2b.

One example of mixers 24, 26 and 36 shown in FIGS. 2a and 2b is schematically depicted in FIG. 4. FIG. 4 is a fully balanced exclusive OR (XOR) gate similar to what is shown by L. Schmidt et. al., "New High Speed Bipolar Xor Gate with Absolutely Symmetrical Circuit Configuration," Electronics Letters, Vol. 26, pages 430-31 (1990). Half the circuit shown in FIG. 4 is a Gilbert multiplier or equivalently a common mode logic (CML) XOR gate generally denoted by reference numeral 60. Each circuit half is comprised of a lower differential pair of transistors 62 and two upper differential pair of transistors 64 and 66. The signal $y_1$ and a derived signal, $y_{1A}$, taken from the other half of the circuit shown in FIG. 4, are coupled through a pair of buffer transistors 68 to the lower differential pair of transistors 62. The collectors of differential pair of transistors 62 in turn are coupled to the emitters of upper differential pair of transistors 64 and 66. The $y_1$ signal is mixed with $y_3$ by means of the buffered or derived signal $y_{3A}$ and its complement taken from the right half circuit 60b, which signals $y_{3A}$ and $y_{3A}^*$ are coupled to the bases of differential pair of transistors 64 and 66. The outputs of differential pair of transistors 64 and 66 are then coupled to a node 70 and node 74 which are coupled to ground through a load resisters 72.

Because the delay time through the bottom differential pair of transistors 62 is longer than through top pairs 64 and 66, a single Gilbert multiplier cell, such as shown in either one half of the circuit 60a or 60b would give rise to an asymmetrical output wave form when used as a frequency doubler. This results in an output voltage with a DC offset that can be significant at high frequencies. In order to avoid this problem, two matched Gilbert circuits 60a and 60b as shown in FIG. 4 are combined in parallel. The derived $y_{1A}$ signal and its complement are provided to the right Gilbert pair of circuit 60a and the derived $y_{3A}$ signal and its complement provided to the left Gilbert multiplier 60b. In other words, the roles of signals $y_1$ and $y_3$ are switched in each of the Gilbert multipliers 60a and 60b. The output of the Gilbert multiplier 60b is similarly coupled to nodes 70 and 74. The outputs of the two Gilbert multipliers are thus summed at the nodes to produce a symmetric output waveform with no offset voltage. In addition, summing the signals in a balanced pair as shown in FIG. 4 results in a cancellation of any added phase error from the mixer. This is a particular advantage when the circuit of FIG. 2a is used as a voltage controlled oscillator in a phase-lock loop circuit.

Figure 5:
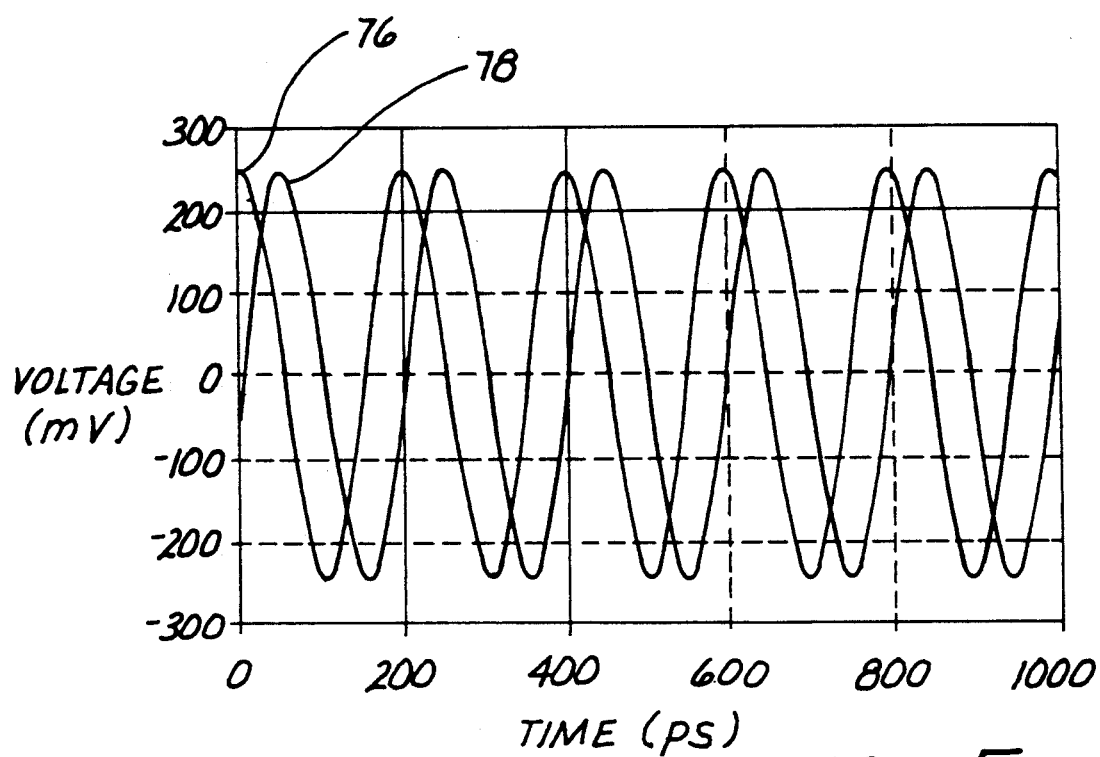
Figure 6:
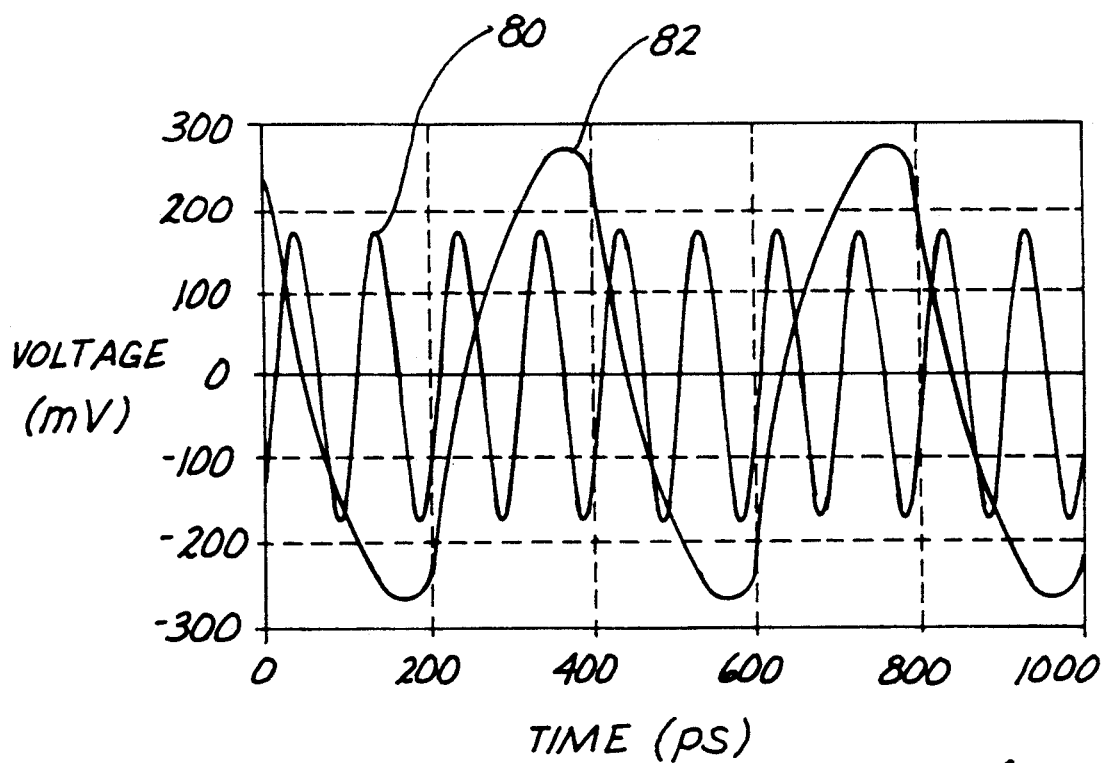
FIG. 6 is a wave diagram showing the output from the highest level of mixers as shown in FIG. 2b at the frequency 4 $F_{osc}$ in comparison to the fundamental frequency of the ring oscillator.

The waveforms of the outputs of the circuits in FIGS. in 2a and 2b can now be appreciated by viewing FIGS. 5 and 6. In FIG. 5 the difference or differential between differential pair of lines 28 and 30 is graphed as a function of time on line 76. Similarly, the difference between the signals on differential pair of lines 32 and 34 is graphed in FIG. 5 on line 78. Although the signals are generated by a digital ring oscillator, the switching times are so close to the theoretical frequency maximum of the switching gates that they appear to be in analog form. The comparison of the waveforms as shown in FIG. 5, which is a simulated output at 5.1 Ghz, shows the two quadrature signals generated at the outputs of mixers 24 and 26 as being exactly 90 degrees apart inphase.

Line 80 in FIG. 6 is a waveform depicting the difference in the signals of the differential pair of lines 38 and 40 output from mixer 36 in FIG. 2b. In comparison, the waveform of line 82 shows the difference in the $y_1$ and $y_1^*$ lines serving as the output of delay element 12 of FIG. 2. FIG. 6 graphically illustrates that the frequency of the signal output from mixer 36 is four times the frequency at the output of the delay elements.

FIGS. 5 and 6 show the simulation of a VCO circuit using the models depicted in FIG. 4 and parameters for an aluminum gallium arsenide/gallium arsenide heterojunction bipolar transistor. The model parameters were optimized by comparing simulator results to measured data of VCO 10 of FIG. 1. For a 3 by 10 sq mm minimum emitter area, the process is characterized, for typical bias conditions of Ic equal to 2 ma by unit current gain frequency of 22 Ghz and a unity power gain frequency of 20 Ghz. The nominal gate delay was approximately 50 picoseconds. The differential I and differential Q signals at 5.1 Ghz are plotted in FIG. 5. Due to the full symmetry of the circuit, no systematic phase offset occurs. Phase separation of two signals in practice is expected to differ slightly from 90 degrees depending upon the exact degree of matching between the delay circuits and the ring oscillator. The frequency output by differential pair of lines 38 and 40 in FIG. 2b was simulated as high as 11 Ghz which is slightly larger than 4 $F_{osc}$.

The time jitter of both the doubled and quadrupled frequency outputs is approximately the same as for the original ring oscillator signal, $y_1$, $y_1^*$. As a result, the effective phase jitter, as a proportion of the period of oscillation, is doubled and quadrupled by mixers 26 and 24 and mixer 36 respectively. The fully differential design minimizes its effect by reducing the initial jitter due to common mode noise rejection and especially due to power supply coupling which is frequently a major source of jitter in conventional high frequency oscillators.

Many modifications and alterations may be made by those having ordinary skill in the art without departing from the spirit and scope of the invention. Therefore, it must be specifically understood that the illustrated embodiment has been set forth only for the purposes of example and should not be taken as limiting the invention as defined by the following claims. Therefore the claims are to be read not only to include the full scope of their literal description, but also to include all equivalents for performing substantially the same function in substantially the same manner to obtain substantially the same result.

We claim:

1. A ring oscillator having an output frequency, said ring oscillator comprising a plurality of inverting delay circuits coupled together in a cascaded series, each delay circuit having an input and an output, said output of one delay circuit coupled to said input of a next sequential one of said delay circuits, said plurality of delay circuits comprising a cascaded series, said cascaded series having a first delay circuit and a last delay circuit, said last delay circuit having its output coupled to said input of said first delay circuit, said cascaded series of delay circuits comprising an odd subplurality of delay circuits and an even subplurality of delay circuits alternately coupled in sequence to each other, said output circuit from consecutive odd delay circuits being 90 degrees out of phase with respect to each other, said outputs from consecutive even delay circuits being 90 degrees out of phase with respect to each other, wherein each said delay circuit has a differential input and differential output and wherein consecutive odd delay circuits have differential outputs whose differentials are 90 degrees out of phase with respect to each other, further comprising a plurality of mixer circuits, each mixer circuit for receiving two output signals from said cascaded series of delay circuits and generating a mixed output therefrom, each one of said plurality of said mixer circuits having outputs from said cascaded series of delay circuits coupled thereto which are 90 degrees out of phase with each other so that said output of said mixer circuit is twice the frequency of said ring oscillator.

2. The improvement of claim 1 further comprising at least one additional mixer circuit having its inputs coupled to said outputs of two of said plurality of mixer circuits, signals provided to said inputs of said additional mixer circuit being 90 degrees out of phase with each other so that said output of said additional mixer circuit is four times said frequency of said ring oscillator.

3. The improvement of claim 1 wherein said plurality of mixer circuits each are fully balanced mixer circuits.

4. The improvement of claim 2 wherein said plurality of mixer circuits are each fully balanced mixer circuits.

5. A high frequency ring oscillator having an output frequency, said ring oscillator comprising:

a plurality of differential circuits coupled together in a series, each differential circuit having a differential input and a differential output, said differential output of one circuit being coupled to said differential input of a next one of said circuits in said plurality of circuits, said plurality of circuits having a first circuit and a last circuit, said differential output of said last circuit being coupled to said differential input of said first circuit, each of said differential circuits having a substantially equal delay, said plurality of circuits comprising an even subplurality of differential circuits and an odd subplurality of differential circuits alternately coupled with each other in said series, said plurality of differential circuits arranged and configured to produce an odd number of inversions of a signal in one pass through said plurality of differential circuits; and a plurality of mixers, each mixer having a pair of differential inputs and generating a differential output, said differential outputs from consecutive ones of said differential circuits of said odd subplurality coupled to one of said plurality of mixers, said differential outputs from consecutive ones of said differential circuits of said even subplurality coupled to inputs of other ones of said mixers, said differential outputs of said mixers which are coupled to said even and odd consecutive differential circuits producing differential output signals at twice said frequency of said ring oscillator and in quadrature with each other.

6. The ring oscillator of claim 5 further comprising an additional one of said mixers, said outputs of said mixers which are in quadrature being coupled as inputs to said additional mixer, said output of said additional mixer being a differential signal with a frequency four times said frequency of said ring oscillator.

7. The ring oscillator of claim 6 wherein each of said mixers is a fully balanced circuit.

8. The ring oscillator of claim 5 wherein said number of differential circuits is an even number and where speed of operation of each of said differential circuits is selectively controllable.

* * * * *